United States Patent [19]

Threewitt

[11] Patent Number: 4,608,678
[45] Date of Patent: Aug. 26, 1986

[54] SEMICONDUCTOR MEMORY DEVICE FOR SERIAL SCAN APPLICATIONS

[75] Inventor: N. Bruce Threewitt, Fremont, Calif.

[73] Assignee: Advanced Micro Devices, Inc., Sunnyvale, Calif.

[21] Appl. No.: 564,969

[22] Filed: Dec. 23, 1983

[51] Int. Cl.$^4$ ............................................. G11C 13/00
[52] U.S. Cl. .................................... 365/189; 365/230; 365/238
[58] Field of Search ............... 365/189, 193, 230, 238, 365/239, 240

[56] References Cited

U.S. PATENT DOCUMENTS 4,375,678 3/1983 Krebs, Jr. ............................ 365/238

Primary Examiner—Terrell W. Fears
Attorney, Agent, or Firm—J. Vincent Tortolano; Patrick T. King

[57] ABSTRACT

An improved semiconductor memory device for serial scan applications is presented. The semiconductor memory device as presented includes a main memory means combined with an on-board means for implementing a shift register function. The shift register function of the present invention is implemented by utilizing a secondary memory means in conjunction with parallel loadable, multiple-bit address counters.

13 Claims, 3 Drawing Figures

SEMICONDUCTOR MEMORY DEVICE FOR SERIAL SCAN APPLICATIONS

BACKGROUND OF THE INVENTION

1. Field of the Invention

This invention relates to integrated circuit semiconductor memories, and particularly to an improved semiconductor memory device for use in serial scan applications.

2. Description of the Prior Art

Certain problems have been encountered with the use of semiconductor memories in serial scan applications, i.e. applications in which memory data is serially read to a utilization device. In particular, the restrictions on time available for memory access during the scanning operation causes overall system performance to suffer.

An example of the memory access problems that are encountered in serial scan applications can be seen in the use of semiconductor memories in video display systems. The preferred embodiment of the present invention relates in general to such applications, and in particular to display memory applications for bit-mapped graphics processor systems.

In general a graphics processor is an integrated circuit device which causes graphics symbols to be displayed on a video screen in response to a system user's input on a standard keyboard terminal. In a graphics processor video display system the graphics processor is linked to a video display memory system.

In a video display memory system, the display memory is often larger than the screen memory (that portion displayed on a screen at any given time). The screen memory may be moved horizontally or vertically relative to the display memory. This process is called scrolling. Furthermore, a non-contiguous portion of the display memory contents may be moved to the screen memory at an arbitrary location. This process is known as windowing.

In a video display system as described above, the data contained in the display memory must be continually updated within a certain period of time available for such updating.

The screen used in a typical video display system is a cathode ray tube (CRT). The information displayed at any given time on a CRT screen must be refreshed at a standard screen rate.

The operation of causing graphics symbols to be displayed on a video screen therefore involves two separate sub-operations—the processing of graphics information in response to user input, and the displaying of graphics symbols on a video screen. Hence, the graphics processor is required to perform two continual functions—updating the display memory contents and refreshing the CRT screen. To perform both functions, the graphics processor must subtract from the time available for updating the display memory to accomodate the screen refresh. This shared funtionality causes system performance (e.g. system speed, windowing and scrolling functions) to suffer significantly.

A major improvement in system performance can be made if the update and screen refresh functions are separated. This separation can be accomplished by devising a video dynamic random access memory (Video DRAM) system which includes an on-chip shift register. The shift register operates to accept a large number of parallel bits (e.g. 256 or 512) in one transfer cycle of perhaps 300 nanoseconds and then shifts data out in response to a high-speed video clock. This data is shifted out through a separate input and output independent of the random access memory's (RAM's) input and output, and thus, for all practical purposes the update and screen refresh functions are independent.

Video display memory systems have been developed which combine a DRAM with an on-board shift register. Such structures eliminate the bandwidth contention problem outlined above. However, current designs of such structures provide slow memory access (relative to the present invention) and coarse granularity of video display. Furthermore, scrolling can only be done on certain picture element (pixel) boundaries which are fixed as a function of the structure of the shift register employed in the system. Such designs provide only non-smooth scrolling with an erratic movement which is quite visible on a display screen. This form of "hard" scroll makes it difficult to scan rapidly through a document since the jumpy movement of the text cannot be followed by the eye.

Current designs also restrict the windowing process to the movement of data on fixed boundaries of bit positions within the display memory array. Such designs cannot provide smooth display screen panning of windowed data, due to the inherent restrictions on the windowing process. The inferior windowing and scrolling characteristic of such designs pose serious performance problems for video display graphics processor systems.

SUMMARY OF THE INVENTION

An object of the present invention is to improve system performance in systems which include serial scan operations, such as graphics processor video display systems.

Another object of the present invention is to separate the random memory access function from the sequential memory access function in serial scan applications.

A further object of the present invention is to improve the shift register function of a semiconductor memory device in serial scan applications.

Still another object of the present invention is to decrease memory access time in serial scan applications.

An advantage of the present invention is a reduction in system response time due to a decrease in memory access time.

Another advantage of the preferred embodiment of the present invention is elimination of scrolling limitations which cause hard scrolling with an erratic movement visible on a video display screen.

A further advantage of the preferred embodiment of the present invention is the elimination of restrictions on the windowing operation to allow data to be shifted from any desired bit position, thus allowing data to be smoothly panned on a video display screen.

According to the present invention, a semiconductor memory device is configured to provide improved system performance in serial scan applications. Specifically, the present invention includes a main memory configured as a dynamic random access memory (RAM) array, combined with an on-board means for implementing a shift-register function.

An important aspect of the present invention is the implementation of the shift register function by utilizing a secondary (or "shift register") memory means in conjunction with parallel loadable, multiple-bit address counters.

According to the present invention, data from the main dynamic RAM can be transferred on a column-by-column basis into a shift register means which includes first and second column-wide static random access memory (RAM) arrays, each of which have bit widths equal to the number of bits in one column of the main memory. Each static RAM array operates in conjunction with a parallel loadable, multiple-bit address counter. The bit width of the address counter is equal to the number of bits necessary to address one bit position in the shift register memory. This configuration permits data transfers beginning at any desirable bit-position in the main memory array. Data can be transferred from the main memory to the shift register and vice versa.

The invention will be better understood by reference to the following detailed description studied in connection with the accompanying drawings.

DETAILED DESCRIPTION OF A SPECIFIC EMBODIMENT

Reference is now made in detail to a specific embodiment of the present invention, which illustrates the best mode presently contemplated by the inventor for practicing the invention, the specific embodiment of which is set forth in the accompanying drawings.

The random access memory system of the present invention has general application to serial scan applications, i.e. applications in which memory data is serially read to a utilization device. A video disply memory system is one such application. According to the specific embodiment of the present invention, a semiconductor memory device comprising a video dynamic random access memory system is presented. The structure of the present invention will be discussed first, followed by a discussion of the functional operation of the present invention.

Figure 1:
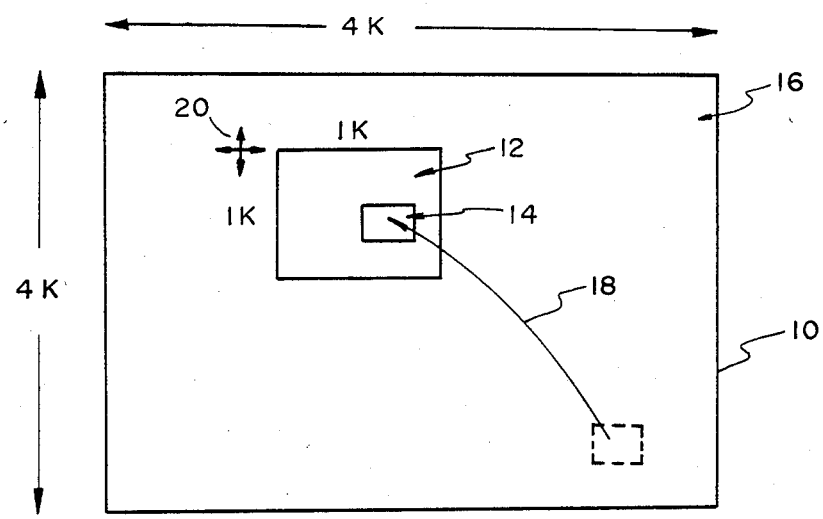
FIG. 1 is a block diagram of a conventional video display memory system showing the interrelationship between the main display memory array and the screen and window memory arrays.

FIG. 1 is a representation of a conventional video display memory system 10 indicating the relationship of a screen memory 12 and a window memory 14 to a main display memory 16. The main display memory 16 is a dynamic random access memory (DRAM) array. The main display memory 16 contains information to be displayed on a video screen. The screen memory 12 contains the information displayed on the video screen at any given time, and is typically smaller than the display memory 16. The memory array sizes indicated in FIG. 1 are merely illustrative for the purpose of describing the present invention. The window memory 14 contains a portion of the contents of the display memory 16 to be moved to the screen memory 12 at some arbitrary location (a process called windowing). The movement of a data portion from the display memory 16 to the screen memory 12 is indicated by arrow 18.

The screen memory 12 may be moved horizontally or vertically relative to the display memory 16 as indicated by arrows 20. This process, called scrolling, is one of the main requirements of any video display system.

Figure 2:
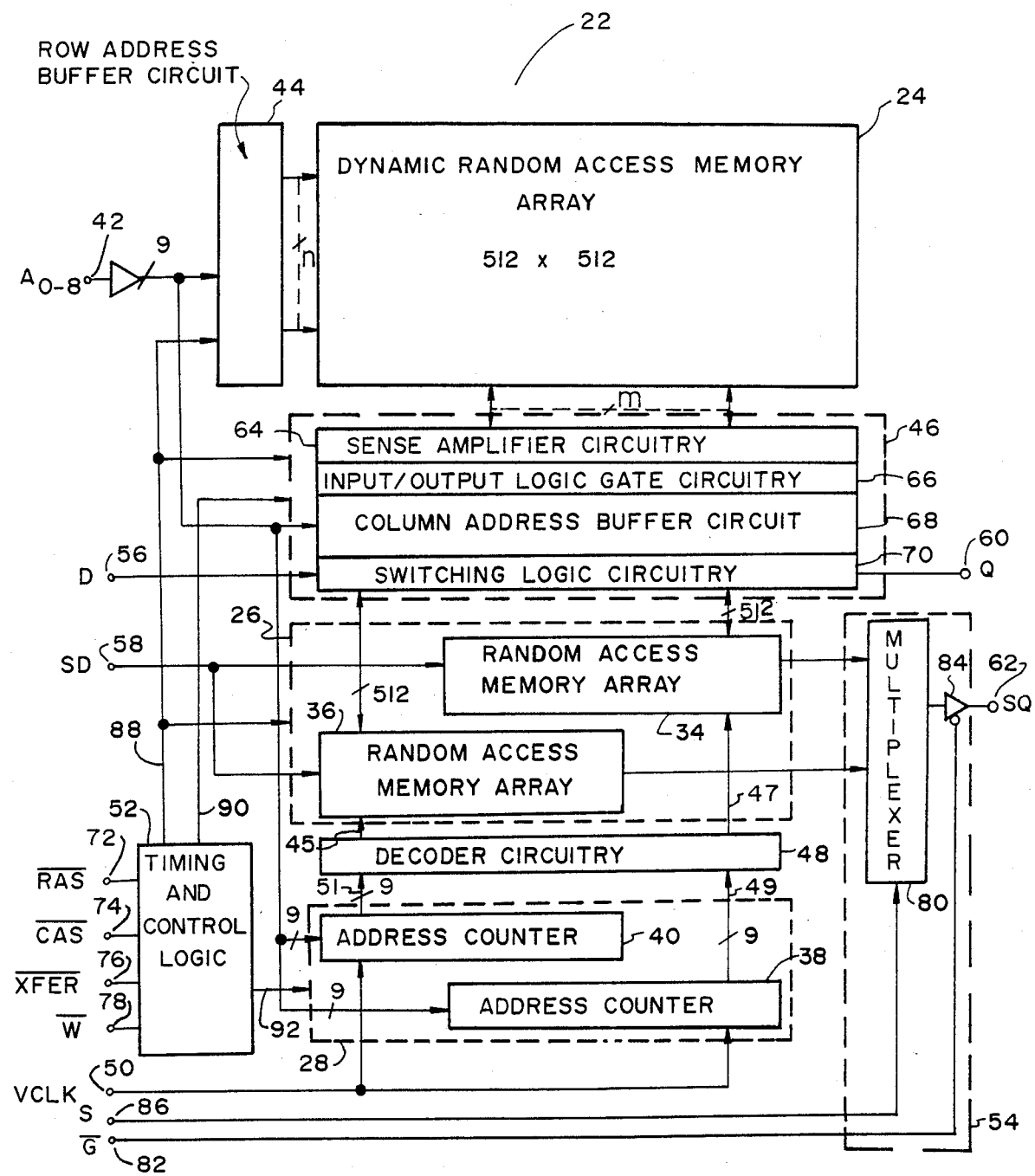
FIG. 2 is a block diagram of a semiconductor memory device according to the present invention.

FIG. 2 shows a block diagram of an improved semiconductor memory device 22, according to the present invention, for use in serial scan applications. The specific embodiment illustrates the application of the present invention to video display memory systems. The memory array and address counter sizes indicated in FIG. 2 are merely illustrative for the purpose of describing the present invention. The primary components included in a semiconductor memory device 22 are a main memory means 24, for containing information to be displayed on a video screen, a secondary memory means 26 for containing data transferred from, or to be transferred to, the main memory means 24, and an addressing means 28 for providing the secondary memory means 26 with start addresses indicating bit positions within the secondary memory means 26, at which bit positions data is to be presented to a serial data output (SQ) terminal 62. The main memory means 24 is configured as a dynamic random access memory (DRAM) array. The secondary memory means 26 includes a first random access memory array 34, and a second random access memory array 36. The addressing means 28 includes a first address counter means 38 for controlling the bit position within first RAM array 34 at which a transfer of data is to begin. The addressing means 28 also includes a second address counter means 40 for controlling the bit position within second RAM array 36 at which a transfer of data is to begin. The first and second address counter means 38 and 40 are parallel-loadable by signals on a plurality of address input ($A_{0-8}$) terminals 42 to indicate starting locations at which locations shifting of data is to begin.

According to the present invention, the semiconductor memory device 22 also includes a row address buffer circuit 44, a means 46 for coupling the main memory means 24 to the secondary memory means 26, a decoder circuit 48 for coupling the addressing means 28 to the secondary memory means 26, a video clock terminal 50 for receiving timing signals generated by a high-speed video clock (not shown), a logic circuit means 52 for controlling the switching and timing of the semiconductor memory device 22, and a means 54 for enabling the output of serial data from the semiconductor memory device 22.

The semiconductor memory device 22 further includes a random access data input (D) terminal 56, a serial data input (SD) terminal 58, a random access data output (Q) terminal 60, and a serial data output (SQ) terminal 62.

The means 46 for coupling the main memory means 24 to the secondary memory means 26 includes a sense amplifier circuit means 64, an input/output logic gate circuit means 66, a column address buffer circuit 68, and a switching logic circuit means 70. The logic circuit means 52 for controlling the timing and switching of semiconductor memory device 22 includes a row address strobe ($\overline{RAS}$) terminal 72, a column address strobe ($\overline{CAS}$) terminal 74, an operation select ($\overline{XFER}$) terminal 76 and a write enable ($\overline{W}$) terminal 78. The means 54 for enabling the output of serial data includes a multiplexer circuit 80, a serial output buffer circuit 84, a serial output enable ($\overline{G}$) terminal 82, and a register select (S) terminal 86.

Structurally, the semiconductor memory device 22 is configured as follows: the address input ($A_{0-8}$) terminals 42 are coupled to the row address buffer circuit 44, the column address buffer circuit 68 and the addressing means 28. The output of row address buffer circuit 44 is coupled to the address input of the main memory means 24. The data input/outputs of the main memory means 24 are coupled to the data inputs of the secondary memory means 26 through the means for coupling 46. Within the means 46 for coupling the main memory means 24 to the secondary memory means 26, the sense amplifier circuit means 64 is coupled between the main memory means 24 and the input/output logic gate circuit means 66, the input/output logic gate circuit means 66 is coupled between the sense amplifier circuit means 64 and the column address buffer circuit 68, the column address buffer circuit 68 is coupled between the input/output logic gate circuit means 66 and the switching logic circuit means 70, and the switching logic circuit means 70 is coupled between column address buffer circuit 68 and secondary memory means 26.

The secondary memory means 26 is coupled to the output terminals 45 and 47 of decoder circuit 48. The decoder circuit 48 is coupled between the secondary memory means 26 and the addressing means 28. Specifically, a plurality of output terminals 49 from the first address counter means 38, and a plurality of output terminals 51 from the second address counter means 40, are coupled to the decoder circuit 48. The addressing means 28 is also coupled to the address input ($A_{0-8}$) terminals 42, and is further coupled to a high-speed video clock (not shown) at the video clock terminal (VCLK) 50.

The means 54 for enabling the output of serial data is essentially the multiplexer circuit 80 coupled between the outputs of RAM arrays 34, 36 and the serial data output (SQ) terminal 62, through the serial output buffer circuit 84. The multiplexer circuit 80 also has an input terminal coupled to the register select (S) terminal 86 of the semiconductor memory device 22.

The logic circuit means 52 performs the requisite timing and control functions associated with devices incorporating memory circuit-to-logic circuit interface designed for use in serial scan applications. In FIG. 2 the coupling of the logic circuit means 52 to the other components within semiconductor memory device 22 is represented diagramatically by the output lines 88, 90 and 92. The output lines 88, 90 and 92 represent the internal connections which are necessary to describe the structure and operation of the present invention. The logic circuit means 52 is coupled on output line 88 to the row address buffer circuit 44. The output line 88 also couples the logic circuit means 52 to the secondary memory means 26. The logic circuit means 52 is also coupled on output lines 88 and 90, to the means for coupling 46. The logic circuit means 52 is further coupled, on output line 92 to the addressing means 28. Those elements of timing and control which are specific to the present invention are described below in connection with the discussion of the operation of the present invention.

Figure 3:
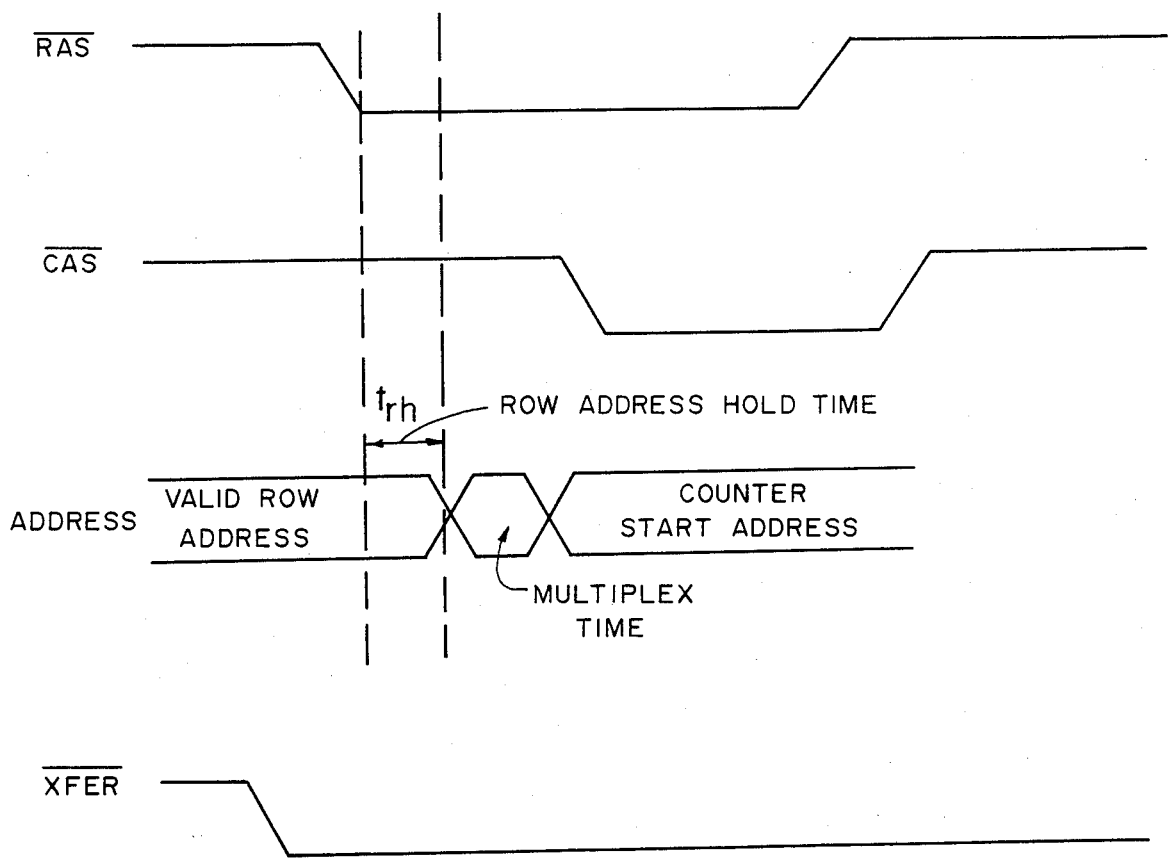
FIG. 3 is a timing diagram showing the switching waveform of the transfer cycle in the device of the present invention.

The following detailed description of the operation of the present invention refers to the specific embodiment of the present invention shown in FIG. 2 and the timing diagram shown in FIG. 3. FIG. 3 represents the switching waveforms of the transfer cycle of the present invention.

In operation, the semiconductor memory device 22 is capable of both random access or sequential access (shift register) operation. Eighteen binary input address bits are required to decode any one of 262,144 cell locations within the main memory means 24. When nine row address bits are established on the address input ($A_{0-8}$) terminals 42, they are loaded (latched) to the row address buffer circuit 44 by a logic-LOW signal on the row address strobe ($\overline{RAS}$) terminal 72. The nine column address bits established on the address input ($A_{0-8}$) terminals 42 after a certain row-address hold time, $t_{rh}$, (see FIG. 3) are loaded into the column address buffer circuit 68 by a signal on the column address strobe ($\overline{CAS}$) terminal 74.

A signal on the operation select ($\overline{XFER}$) terminal 76 selects either the transfer or random access operation of the semiconductor memory device 22. To select the random access mode of operation a logic-HIGH signal is held on the operation select ($\overline{XFER}$) terminal 76 as the signal on the row address strobe ($\overline{RAS}$) terminal 72 goes to a logic-LOW. This restricts transfer of data between the shift register (i.e. the secondary memory means 26 and the address counter means 38 and 40) and the main memory means 24, by disconnecting the 512 elements of the RAM arrays 34 or 36 from the corresponding bits within the main memory means 24.

Referring to FIG. 3, the transfer operation of the semiconductor memory device 22 is activated by a logic-LOW signal appearing on the operation select ($\overline{XFER}$) terminal 76 before the signal on the row address strobe ($\overline{RAS}$) terminal 72 falls to a logic-LOW. This activates the switches connecting the 512 elements of either the RAM array 34 or the RAM array 36 to the 512 bit lines of the main memory means 24. The signal on the register select (S) terminal 86 determines which of the RAM arrays will be accessed during the transfer operating mode of semiconductor memory device 22.

When the semiconductor memory device 22 is operating in the transfer mode, the signal on the write enable ($\overline{W}$) terminal 78 will determine whether data will be transferred to or from the RAM array (34 or 36) being accessed. When a logic-LOW signal appears on write enable ($\overline{W}$) terminal 78, data will be transferred from whichever RAM array is being accessed, to the main memory means 24. Conversely, when a logic-HIGH signal appears on write enable ($\overline{W}$) terminal 78, data will be transferred from the main memory means 24 to whichever RAM array is being accessed, as determined by the signal on the register select (S) terminal 86. Thus, the read and write cycles are always with respect to the main memory means 24.

Nine address bits on the address input ($A_{0-8}$) terminals 42 are required to select one of the 512 possible rows involved in the transfer of data to or from either of RAM arrays 34 or 36. The address inputs are loaded into the first or second nine-bit address counter means 38 and 40, thus allowing data transfers beginning at any bit-position in either of the RAM arrays 34 or 36.

An address latched on the address input ($A_{0-8}$) terminals 42 produces a data output on the random access data output (Q) terminal 60, per the cell-information of the row and column addressed. In a read cycle, this occurs after an access period following a transition on the row address strobe ($\overline{RAS}$) terminal 72. Another read on the same row can be performed only by changing the column address. In a write cycle, a data input on the random access data input (D) terminal 56 is written into the main memory means 24 by a logic-HIGH to logic-LOW transition on the write enable ($\overline{W}$) terminal 78 at the address entered on the address input ($A_{0-8}$) terminals 42.

The main memory means 24 is comprised of dynamic storage elements; thus, data stored within them will be lost unless refreshed periodically. Refresh of the memory cells within the main memory means 24 is accomplished by strobing each of the row addresses via the row address strobe (RAS) terminal 72, which causes all bits in each row to be refreshed. Transfer of a row of data from the main memory means 24 to the RAM arrays 34 or 36 also refreshes that particular row.

The use of two RAM array/address counter configurations as shift registers allows windowing of data at any position on a video display screen. While the RAM array 34 carries the pixel information for a window, the RAM array 36 might carry the pixel information for the "background" or vice versa. As indicated above, which window is displayed on the screen at any given time is determined by the signal on the register select (S) terminal 86.

During the sequential access operation of the semiconductor memory device 22, data is serially shifted out of either the RAM array 34 or the RAM array 36 in response to timing signals which are generated by a high-speed video clock (not shown) and are received on the video clock (VCLK) terminal 50. Data can be stored in the RAM arrays 34 or 36 by a serial shift-in on the serial data input (SD) terminal 58 or by a parallel load from one of the rows in the main memory means 24.

The means 54 for controlling the output of serial data provides the dual function of selecting the RAM array from which data is to be shifted, and selecting the device in which the shifting-out operation is to occur. The serial output enable (G) terminal 82 activates or restricts the shifting-out operation by controlling the impedance of the serial data output (SQ) terminal 62. When a logic-LOW signal is present on the serial output enable (G) terminal 82, the serial data output (SQ) terminal 62 will be in a low-impedance state, and thus enabled, and serial data will be read out. Conversely, a logic-HIGH signal on the serial output enable (G) terminal 82 causes the serial data output (SQ) terminal 62 to be in a high-impedance state preventing the occurrence of the shifting-out operation. The operation of the serial output enable (G) terminal 82 allows more than one bank of devices like the semiconductor memory device 22 to be multiplexed into the same external circuitry.

The foregoing description of a specific embodiment of the present invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto and their equivalents.

What is claimed is:

1. An improved semiconductor memory device for use in serial scan applications, said semiconductor memory device having a main memory means for storing data, having a plurality of address input terminals, having a video clock input terminal, and further having a logic circuit means for controlling the timing and switching of said semiconductor memory device, said semiconductor memory device further comprising:
   (a) secondary memory means for storing data transferred to and from said main memory means; and
   (b) addressing means having a plurality of input terminals coupled to said address input terminals, having a timing signal input terminal coupled to said video clock input terminal and further having a plurality of output terminals coupled to said secondary memory means, said addressing means disposed for providing said secondary memory means with a start address within the secondary memory means, said start address indicating a predetermined bit position within the secondary memory means at which predetermined bit position a transfer of data is to begin, so as to allow said transfer of data to begin at any desirable predetermined bit-position in the secondary memory means.

2. The device of claim 1 wherein said addressing means includes first and second address counter means for controlling the bit positions within said secondary memory means at which bit positions transfers of data to and from said main memory means are to begin.

3. The device of claim 1 wherein said secondary memory means includes first and second random access memory arrays.

4. The device of claim 1 wherein said semiconductor memory device further includes:
   (a) a plurality of address input terminals for receiving address codes indicating cell locations within said semiconductor memory device;
   (b) a row address buffer circuit coupled to said address input terminals, said row address buffer circuit disposed for storing and decoding row address codes received from said address input terminals; and
   (c) means for enabling the output of serial data from said semiconductor memory device, said means for enabling the output of serial data being coupled to a serial data output terminal of said semiconductor memory device.

5. The device of claim 4 wherein said means for enabling the output of serial data from said semiconductor memory device includes:
   (a) a multiplexer circuit having a first serial data input terminal coupled to an output terminal of said first random access memory array, having a second serial data input terminal coupled to an output terminal of said second random access memory array, said multiplexer circuit also having a register enabling input terminal and an output terminal;
   (b) a serial output buffer circuit having an input terminal coupled to the output terminal of said multiplexer circuit and further having an output terminal coupled to the serial data output terminal of said semiconductor memory device;
   (c) a serial output enable terminal coupled to said serial output buffer circuit; and
   (d) a register select terminal coupled to said register enabling input terminal of said multiplexer circuit.

6. An improved semiconductor memory device for use in serial scan applications, said semiconductor memory device having a random access data input terminal, a serial data input terminal, a random access data output terminal, and a serial data output terminal, said semiconductor memory device further comprising:
   (a) a plurality of address input terminals for receiving address codes indicating cell locations within said semiconductor memory device;
   (b) a row address buffer circuit coupled to said address input terminals, said row address buffer circuit disposed for storing and decoding row address codes received from said address input terminals;

(c) a main memory means for storing data;

(d) a secondary memory means for storing data transferred from, or to be transferred to, said main memory means;

(e) addressing means having a plurality of input terminals coupled to the address input terminals, and having a timing signal input terminal, and further having a plurality of output terminals, said addressing means disposed for providing said secondary memory means with a start address within the main memory means, said start address indicating a predetermined bit position within the main memory means at which a transfer of data is to begin, so as to allow said transfer of data to begin at any desirable predetermined bit-position in the secondary memory means;

(f) logic circuit means for controlling the timing and switching of said semiconductor memory device, said logic circuit means for controlling the timing and switching of said semiconductor memory device having a first output terminal coupled to said row address buffer circuit, said first output terminal also being coupled to said secondary memory means and being further coupled to said addressing means, said logic circuit means for controlling the timing and switching of said semiconductor memory device also having a second output terminal; and (g) means for enabling the output of serial data from said semiconductor device, said means for enabling the output of serial data being coupled to the serial data output terminal.

7. The device of claim 6 wherein said addressing means includes first and second address counter means for controlling the bit positions within said secondary memory means at which bit positions transfers of data to and from said main memory means are to begin.

8. The device of claim 6 wherein said secondary memory means includes first and second random access memory arrays.

9. The device of claim 6 wherein said semiconductor memory device further includes a means for coupling the main memory means to the secondary memory means, said means for coupling the main memory means to the secondary memory means being further coupled to said second output terminal of said logic circuit means for controlling the timing and switching of said semiconductor memory device, wherein said means for coupling the main memory means to the secondary memory means comprises:

(a) sense amplifier circuit means for sensing information in the cells of the main memory means, said sense amplifier circuit means having a plurality of output terminals;

(b) input/output logic gate circuit means coupled to the output terminals of said sense amplifier circuit means for receiving input and output signals transmitted to and from the main memory means;

(c) a column address buffer circuit coupled to said address input terminals, said column address buffer circuit disposed for storing and decoding column address codes received from said address input terminals; and (d) switching logic circuit means coupled to the random access data input terminal and further coupled to the random access data output terminal, said switching logic circuit means being disposed for controlling the input and output of random access data to and from said semiconductor memory device, said means for coupling the main memory means to the secondary memory means being configured such that said sense amplifier circuit means is coupled between the main memory means and said input/output logic gate circuit means, said input/output logic gate circuit means is coupled between the output terminals of said sense amplifier circuit means and said column address buffer circuit, said column address buffer circuit is coupled between said input/output logic gate circuit means and said switching logic circuit means, and said switching logic circuit means is coupled between said column address buffer circuit and the secondary memory means.

10. The device of claim 6 wherein said semiconductor memory device further includes a means for coupling the addressing means to the secondary memory means, wherein said means for coupling the addressing means to the secondary memory means comprises a decoder circuit.

11. The device of claim 6 wherein said means for enabling the output of serial data from said semiconductor memory circuit includes:

(a) a multiplexer circuit having first and second serial data input terminals coupled respectively to the output terminals of said first and second random access memory arrays, said multiplexer circuit also having a register enabling input terminal and an output terminal;

(b) a serial output buffer circuit having an input terminal coupled to the output terminal of said multiplexer circuit and further having an output terminal coupled to the serial data output terminal of said semiconductor memory device;

(c) a serial output enable terminal coupled to said serial output buffer circuit; and (d) a register select terminal coupled to said register enabling input terminal of said multiplexer circuit.

12. In a semiconductor dynamic random access memory device for use in serial scan applications, said semiconductor memory device having a main memory means for storing data, having a plurality of address input terminals and having a video clock input terminal, a method of separating the random memory access and serial scan operations of said semiconductor dynamic random access memory device, such that the random memory access and serial scan operations are performed independently of one another, said method comprising the steps of:

(a) storing, in a secondary memory means, data transferred to and from said main memory means; and (b) addressing predetermined start-address bit positions within the secondary memory means, at which predetermined bit positions transfers of data are to begin, so as to allow said transfers of data to begin at any desirable predetermined bit-position in the secondary memory means.

13. The method according to claim 12 wherein said addressing includes loading into an addressing means start addresses according to column address bits established on a plurality of address input terminals, said start addresses indicating predetermined bit positions within the secondary memory means at which predetermined bit positions transfers, of data are to begin.

* * * * *